(12) United States Patent
Maloyan et al.

(10) Patent No.: US 7,236,340 B2
(45) Date of Patent: Jun. 26, 2007

(54) GATE CONTROL CIRCUIT FOR PREVENTION OF TURN-OFF AVALANCHE OF POWER MOSFETS

(75) Inventors: Shahin Maloyan, Northridge, CA (US); Ajit Dubhashi, Redondo Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 391 days.

(21) Appl. No.: 10/364,956

(22) Filed: Feb. 11, 2003

(65) Prior Publication Data

US 2003/0169088 A1      Sep. 11, 2003

Related U.S. Application Data

(60) Provisional application No. 60/356,553, filed on Feb. 11, 2002.

(51) Int. Cl.
*H02H 9/08* (2006.01)

(52) U.S. Cl. .................................. 361/79; 361/93.9

(58) Field of Classification Search ............... 361/93.7, 361/93.8, 93.9, 100, 115, 79; 327/170, 381
See application file for complete search history.

(56) References Cited

U.S. PATENT DOCUMENTS

| | | | | |
|---|---|---|---|---|
| 4,721,869 A * | 1/1988 | Okado | ........................ | 326/14 |
| 5,200,879 A * | 4/1993 | Sasagawa et al. | ............ | 361/94 |
| 5,321,313 A * | 6/1994 | Oberhauser | ................. | 327/432 |
| 6,160,691 A * | 12/2000 | Shen et al. | .................... | 361/79 |
| 6,208,185 B1 * | 3/2001 | John et al. | .................. | 327/170 |
| 6,556,407 B2 * | 4/2003 | Brando et al. | .............. | 361/100 |
| 6,717,785 B2 * | 4/2004 | Fukuda et al. | ............. | 361/93.1 |

* cited by examiner

*Primary Examiner*—Stephen W. Jackson
*Assistant Examiner*—Danny Nguyen
(74) *Attorney, Agent, or Firm*—Ostrolenk, Faber, Gerb & Soffen, LLP

(57) ABSTRACT

A switch in an inductive circuit is prevented from avalanche operation when the switch is turned off. By preventing avalanche, the associated EMI is reduced or eliminated. Switch avalanche can be prevented using an active component, such as a transistor, or a passive component, such as a resistor, coupled to the switch gate to control current in the switch gate. By controlling current in the switch gate during turn-off, avalanche operation can be prevented without a significant increase in turn-off energy.

4 Claims, 6 Drawing Sheets

GATE CONTROL CIRCUIT FOR PREVENTION OF TURN-OFF AVALANCHE OF POWER MOSFETS

RELATED APPLICATION

This application is based on and claims benefit of U.S. Provisional Application No. 60/356,553, filed Feb. 11, 2002 to which a claim of priority is hereby made.

FIELD OF THE INVENTION

This invention relates to control circuits for power MOSFETs and more specifically relates to a novel control circuit and process for turning off power MOSFETs.

BACKGROUND OF THE INVENTION

Power MOSFETs in inductive circuits will frequently go into avalanche during turn off if Eoff (turn-off energy) is to be limited. Avalanche current has a high di/dt and produces high frequency oscillation in the range of 10 MHz to 30 MHz and is a source of EMI radiation.

More specifically, DC-Loop parasitic inductance (Lp) stores energy when a FET in the loop conducts. This energy is discharged in the FET when it turns off. Lp begins to discharge when the drain source voltage Vds exceeds the bus voltage. When Vds reaches BV (breakdown voltage) the FET avalanches. Energy stored in Lp is the lower limit of Eoff In order to get the lowest Eoff that can be achieved with a hard switching circuit, the FET should avalanche at turn-off. Avalanche, however, produces high di/dt and is followed by high frequency voltage oscillations in the range of 10 MHz to 30 MHz. Therefore, to minimize these potential EMI sources avalanche should be avoided.

BRIEF DESCRIPTION OF THE INVENTION

The present invention prevents turn-off avalanche without significantly increasing Eoff by reducing the gate current sink (ig) prior to avalanche. The resulting slow change in gate to source voltage d(Vgs)/dt limits change in the drain to source current d(Ids)/dt, which in turn limits the peak Vds.

Accordingly, the present invention provides a method and system for preventing avalanche in an inductive, switched circuit. The FET is able to sink current without going into avalanche, thereby reducing EMI. In addition, the present invention limits Eoff by controlling the gate current appropriately.

The present invention also supplies a system for controlling the gate current in a form of a switched circuit that responds to voltages and currents applied to a FET switching in an inductive circuit. The system includes a diode that can be made to avalanche in response to energy discharging in the switch to slow the discharge rate of the energy in the switch.

BRIEF DESCRIPTION OF THE DRAWINGS

The present invention is described in greater detail below, with reference to the accompanying drawings, in which.

DETAILED DESCRIPTION OF THE INVENTION

Three turn-off tests are shown and described in FIGS. 1 to 5 and the results are compared in the following table 1. The test set ups and circuits are shows in FIGS. 4 and 5. Common test conditions are: Vbus=40V, Iload=150 A, V gate drive=10V, Tj=25 C.

| Test | Advantage | Concerns | Eoff mJ | di/dt A/ns | dv/dt V/ns | Oscillations |
|---|---|---|---|---|---|---|
| #1-Reduce ig prior to avalanche | Prevents avalanche without significantly increasing Eoff | Must be implemented over temperature and current | 2.2 | 0.5 | 0.5 | None |
| #2-Rg = 90 Ohm, standard drive | A simple of preventing avalanche | Results in a large increase in Eoff | 5.2 | 0.5 | 0.2 | 10V, 20MHz |
| #3-Rg = 5 Ohm, standard drive | Lowest possible Eoff | Avalanches the FET | 1.4 | 1 | 1 | 50V, 20MHz |

Figure 1:
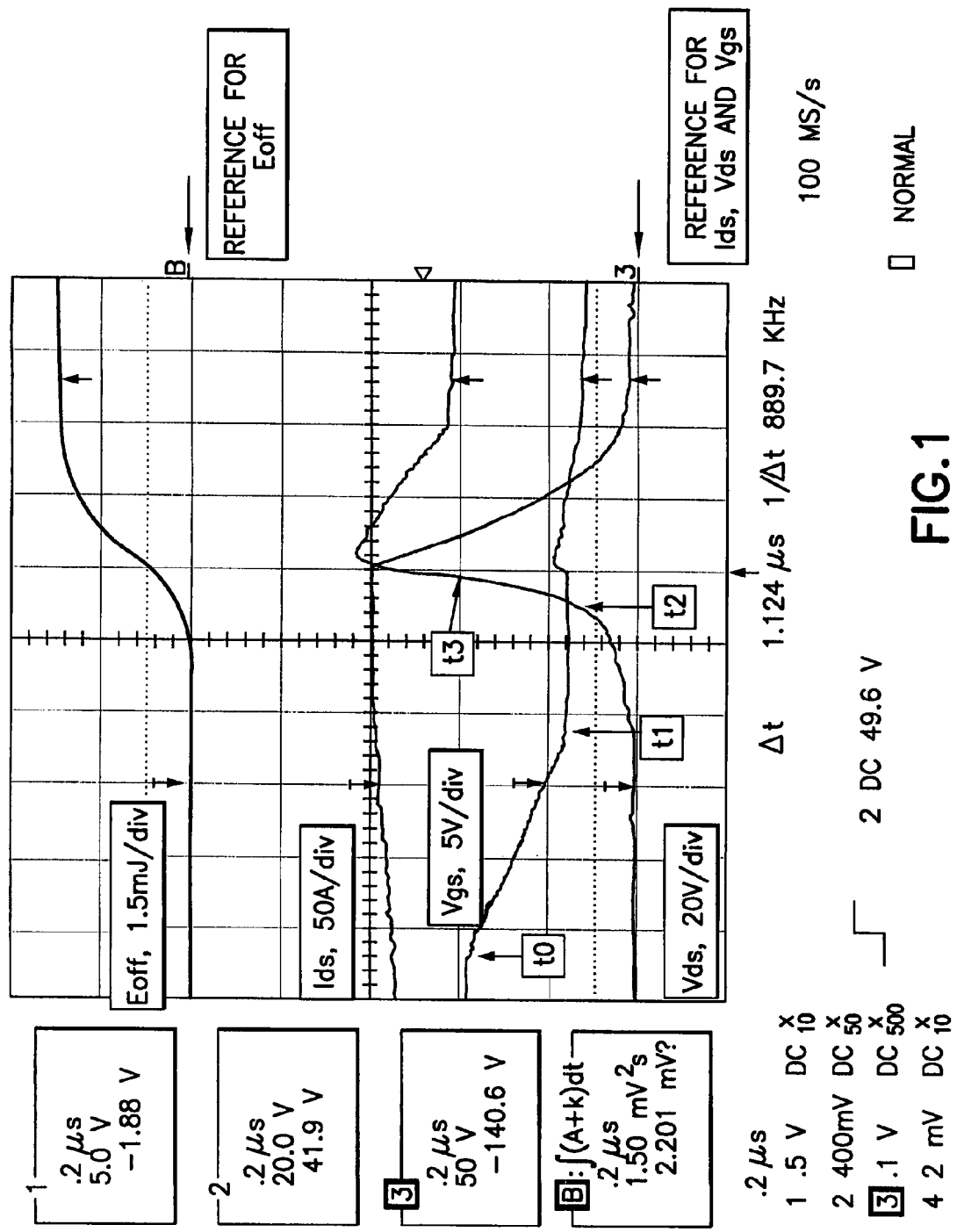
FIG. 1 are turn-off wave forms showing prevention of avalanche in the circuit of FIG. 4 by reducing ig prior to avalanche.

In the first test avalanche is prevented without a significant increase in Eoff (see FIG. 1). This is accomplished by initially using a large sink current and then reducing it prior to avalanche. Low ig limits d(Ids)/dt which in turn limits peak Vds. In the second test avalanche is prevented but results in a significant increase in Eoff (see FIG. 2). This test uses a large Rg and a standard gate drive. The last test is a fast turn-off which achieves the lowest possible Eoff, however, it avalanches the FET (see FIG. 3).

1. Preventing Avalanche by Reducing ig Prior to Avalanche

Figure 4:
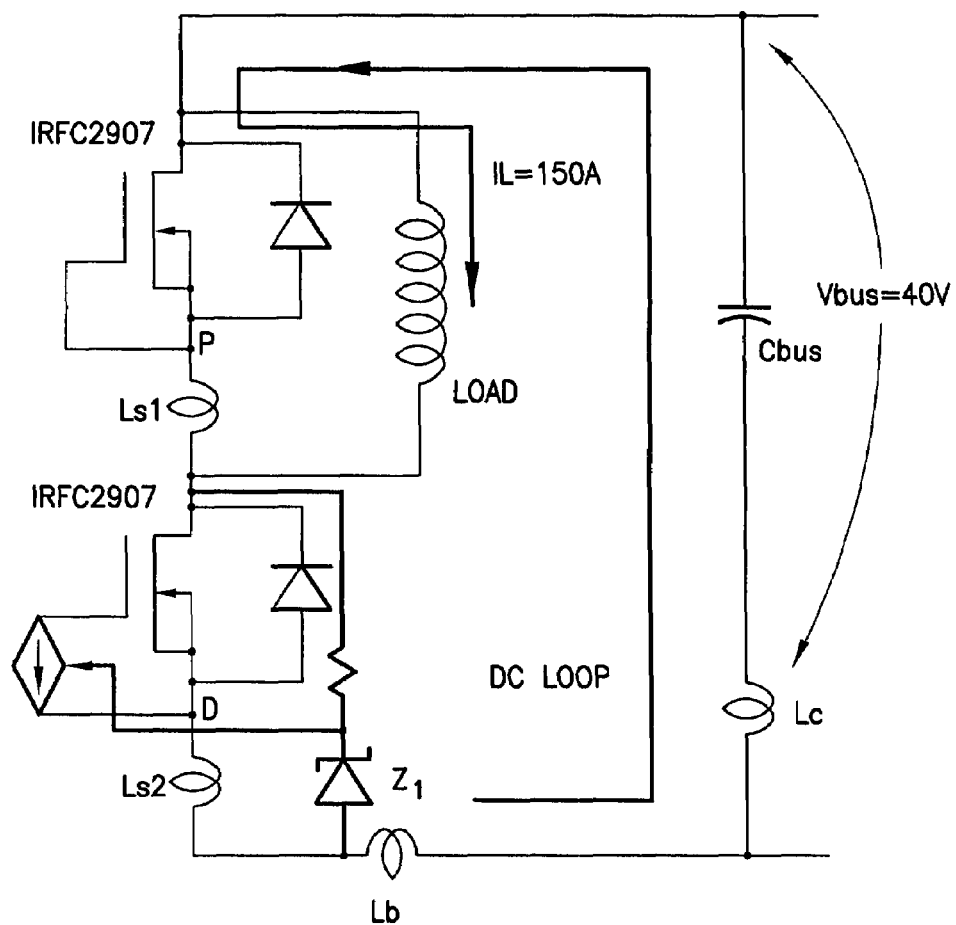
FIG. 4 shows a circuit which employs the invention in which the gate current of the lower MOSFET is reduced prior to avalanche as shown in FIG. 1.
Figure 6:
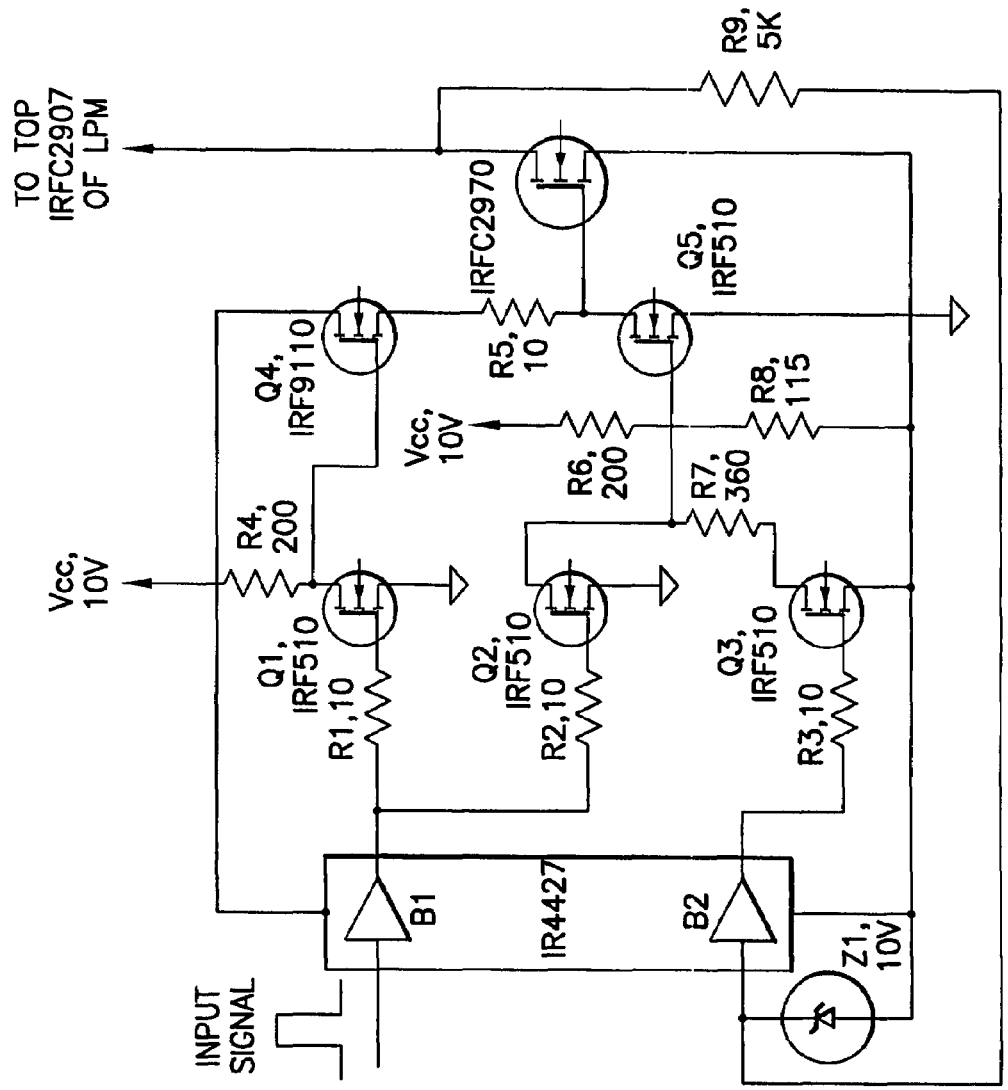
FIG. 6 shows the gate control circuit details for the novel circuit of FIG. 4.

In accordance with the invention the gate current ig is reduced prior to avalanche, as shown in FIGS. 1, 4 and 6. In FIG. 4, the total DC loop inductance LP begins discharging its energy when Vds exceeds Vbus at time (t3). If d(Ids)/dt is sufficiently slowed down then Vds will not reach BV and avalanche will be prevented.

The circuit shown in FIGS. 4 and 6 initiates the turn off by applying a 0.25 A current sink that quickly discharges the gate to about (t2). When Vds exceeds 10V the zener diode Z1 avalanches. This activates a circuit that, after a short delay, reduces the gate current and permits the gate to discharge at a slower rate. As seen in FIG. 1, peak Vds is limited to 64V. Turn-off energy is 2.2 mJ. There are no oscillations following turn-off.

2. Preventing Avalanche by Using Rg=90 Ohm

Figure 2:
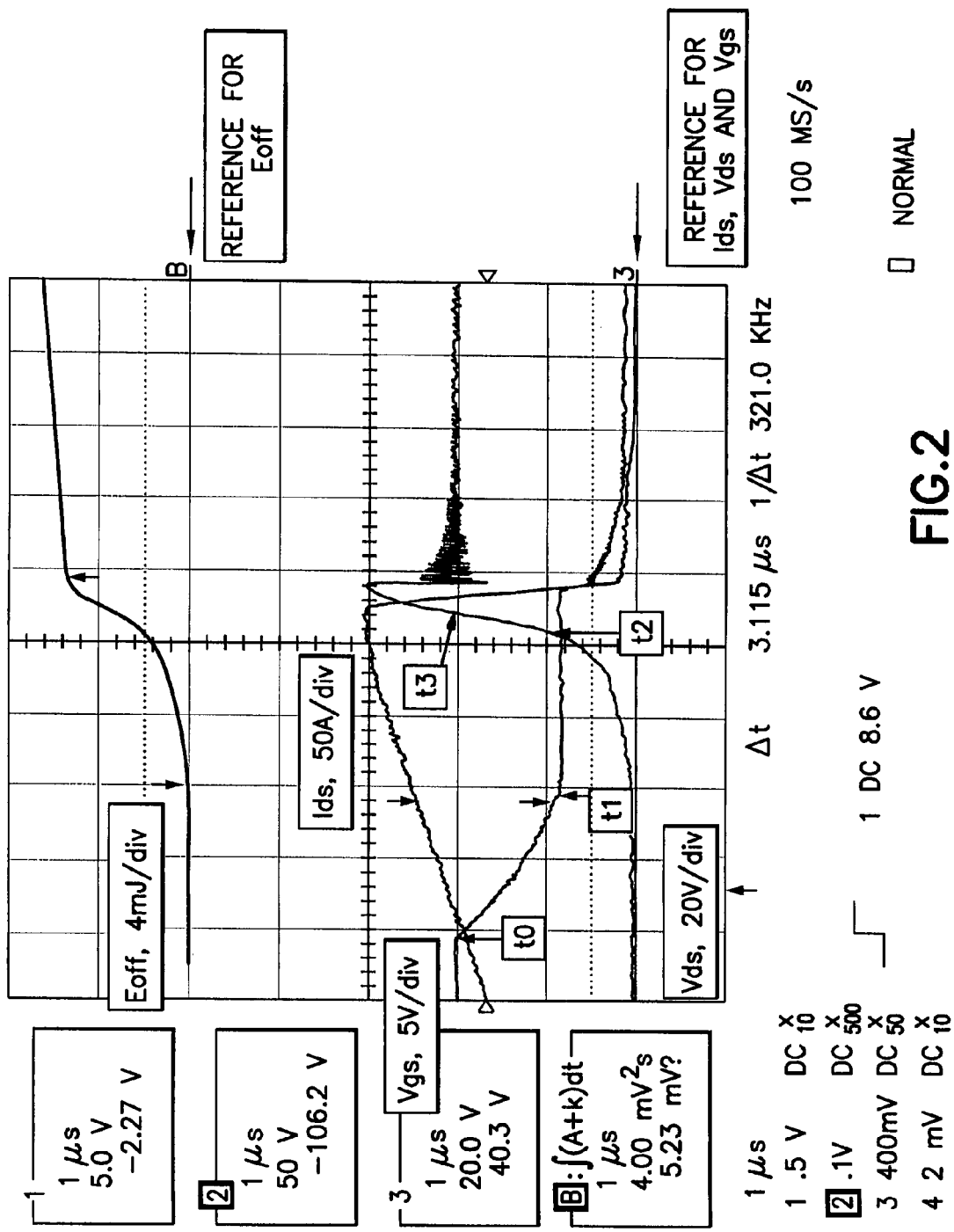
FIG. 2 are turn-off wave forms in which avalanche is prevented in the circuit of FIG. 5, using a 90 ohm gate resistor.

It is also possible to prevent avalanche by using a gate resistance to slow the turn-off. FIG. 2 shows a MOSFET type IRFC2907 waveforms corresponding to a slow turn-off. A standard gate drive circuit is used with Rg=90 Ohm. The mechanism that prevents avalanche is similar to that of FIG. 1. A slow d(Ids)/dt limits the voltage overshoot to less than BV. Compared to the fast turn-off shown in FIG. 3, oscillations are reduced in amplitude from 50V to less than 10V. Dv/dt is reduced from 1V/ns to 0.2V/ns and di/dt from 1 A/ns to 0.5 A/ns. Eoff, however, has increased from 1.4 mJ to 5.2 mJ. Note that about 50% of Eoff is expended before (t3). This is wasted energy and is not useful for preventing avalanche.

3. Fast Turn-Off

Figure 3:
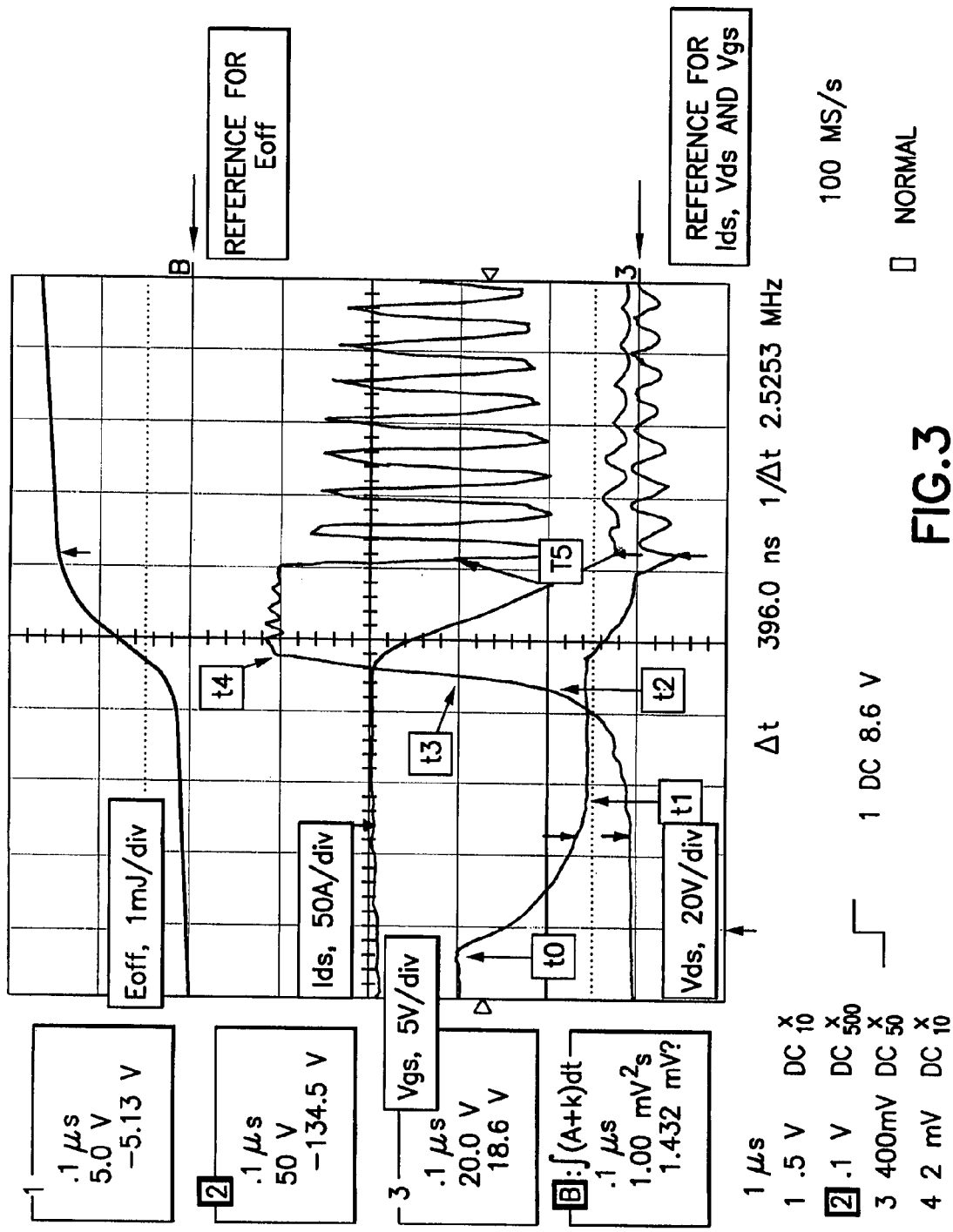
FIG. 3 are turn-off wave forms for the circuit of FIG. 5 in which a gate resistor of 5 ohms is used and in which the low side MOSFET avalanches in turn off.
Figure 5:
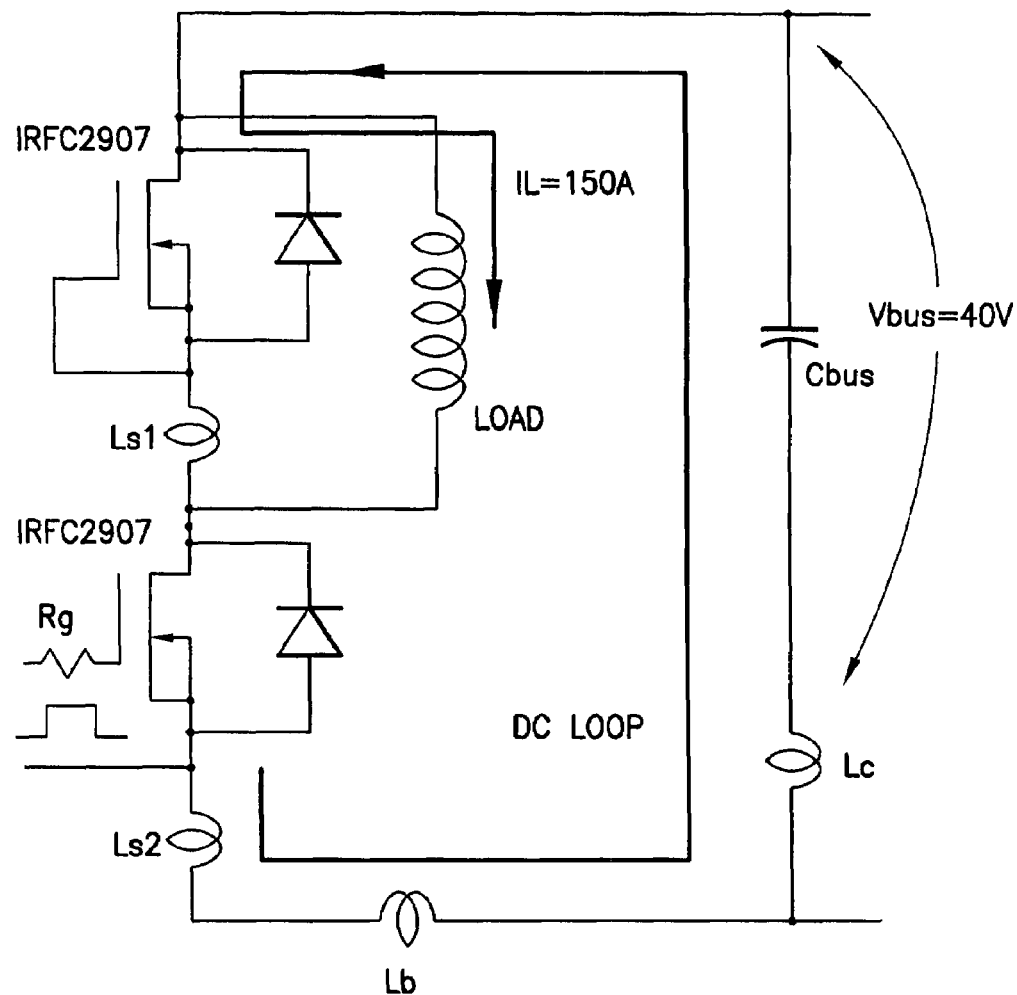
FIG. 5 shows the circuit in which a gate resistor is used resulting in the conditions of FIGS. 2 and 3.

FIG. 3 shows waveforms for the lower MOSFET IRFC2907 of FIG. 5, corresponding to a fast turn-off, Rg=5 Ohm. Avalanche is followed by 20 MHz, 50V oscillations that are likely to be a source of EMI. Dv/dt at t3–t4 and di/dt at t4–t5 are 1 V/ns and 1 A/ns respectively. These are also potential EMI sources. Turn-off energy, however, is 1.4 mJ, the lowest Eoff for these test conditions and this particular half-bridge using hard switching.

FIG. 6 shows the detail of an implementation for the novel circuit of FIG. 4.

The goal of the circuit of FIGS. 4 and 6 is to prevent turn-off avalanche for the IRFC2907 (bottom FET in the half-bridge). The IRFC2907 gate will be referred to as "the Gate".

The operation of FIG. 6 is as follows:

1. If the input signal (shown at the left side) is 0 then Q1 and Q4 are OFF and the Gate is disconnected from Vcc. Q2 is also OFF. Voltage divider R6, R7, & R8 applies sufficient voltage to the gate of Q5 to keep it ON and ground the Gate.

2. When an input signal is applied, Q1 and Q4 turn ON and the Gate gets charged through R5. The input signal also turns Q2 ON. This turns OFF Q5 thereby disconnecting the Gate from ground.

3. When the input signal turns OFF, Q1 and Q4 turn OFF and the Gate is disconnected from Vcc. The input signal also turns Q2 Off. Voltage divider R6 and R8 applies a constant low voltage to Q5's gate. Q5 operating in saturation (i.e., constant current mode) then discharges the Gate.

4. As the Gate discharge continues the Vds of IRFC2907 rises. When it reaches 10V, Z1 avalanches and B2 and Q3 are turned ON. This places R7 is parallel with R8 and reduces the gate voltage of Q5. Q5's constant current is reduced and the Gate discharges at a slower rate. The resulting slow d(Ids)/dt keeps the peak Vds below BV (i.e., no avalanche).

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A circuit for preventing avalanche of a switch connected to an inductive circuit during turn-off comprising:
   an active component coupled to a switch gate for controlling gate current in the switch;
   a first control circuit coupled to the switch gate for turning the switch on and off the first control circuit being further coupled to a gate of the active component for turning the active component off when the switch is turned on and turning the active component on when the switch is turned off;
   a signal source which supplies a signal to the active component for controlling the active component, the signal being related to a switch voltage formed when the switch is turning off such that the current in the switch is discharged at a first rate;
   a second control circuit coupled to the active component and operable to diminish the signal to control the active component to reduce a current in the switch gate to permit discharge of the current in the switch at a second discharge rate which is slower than the first rate until the switch is fully off; and
   an avalanche component coupled to the switch, the avalanche component being operable to avalanche in response to the voltage developed across the switch when the switch is turning off reaching a set value and to thereby operate the second control circuit to establish the second discharge rate.

2. A circuit according to claim 1, further including a passive component which couples the signal source and the second control circuit to the switch gate for controlling the discharge rate of the switch gate.

3. The circuit according to claim 2, wherein the passive component is a resistor.

4. A circuit according to claim 1, further comprising:
   a first signal source for supplying an on/off signal to the switch for controlling the switch, the on/off signal being controlled by the first control circuit.

* * * * *